(12) United States Patent
Maruyama et al.

(10) Patent No.: US 7,663,604 B2
(45) Date of Patent: Feb. 16, 2010

(54) INPUT DEVICE AND ELECTRONIC DEVICE USING THE INPUT DEVICE

(75) Inventors: Shigeaki Maruyama, Kanagawa (JP); Shigeki Motoyama, Kanagawa (JP); Ivan Poupyrev, Tokyo (JP); Keiichi Kimura, Kanagawa (JP)

(73) Assignee: Sony Corporation, Tokyo (JP)

( * ) Notice: Subject to any disclaimer, the term of this patent is extended or adjusted under 35 U.S.C. 154(b) by 450 days.

(21) Appl. No.: 10/525,792

(22) PCT Filed: Aug. 19, 2003

(86) PCT No.: PCT/JP03/10469

§ 371 (c)(1),
(2), (4) Date: Aug. 10, 2005

(87) PCT Pub. No.: WO2004/021160

PCT Pub. Date: Mar. 11, 2004

(65) Prior Publication Data

US 2007/0080951 A1   Apr. 12, 2007

(30) Foreign Application Priority Data

Aug. 29, 2002 (JP) ............................. 2002-251781

(51) Int. Cl.
*G09G 5/00* (2006.01)
(52) U.S. Cl. ...................... 345/173; 345/156
(58) Field of Classification Search ................ 345/156, 345/173; 310/367; 367/160
See application file for complete search history.

(56) References Cited

U.S. PATENT DOCUMENTS

| | | | |
|---|---|---|---|
| 5,856,956 A * | 1/1999 | Toki | ........................... 367/160 |
| 6,128,671 A | 10/2000 | Weijand | |
| 6,822,635 B2 * | 11/2004 | Shahoian et al. | ............. 345/156 |
| 2001/0035854 A1 * | 11/2001 | Rosenberg et al. | .......... 345/156 |
| 2003/0071795 A1 * | 4/2003 | Baldauf et al. | .............. 345/173 |
| 2006/0181179 A1 * | 8/2006 | Wood et al. | ................. 310/367 |

FOREIGN PATENT DOCUMENTS

| | | |
|---|---|---|
| JP | 62-208680 | 9/1987 |
| JP | 164127/1988 | 10/1988 |
| JP | 7-213997 | 8/1995 |

(Continued)

*Primary Examiner*—Amare Mengistu
*Assistant Examiner*—Yuk Chow
(74) *Attorney, Agent, or Firm*—Oblon, Spivak, McClelland, Maier & Neustadt, L.L.P.

(57) ABSTRACT

An input device includes a touch panel with which a user performs an input operation of information by touching the touch panel. The input device further includes a vibration generation device for feeding back, to the user, various kinds of sense of touch in accordance with the type of the information through the touch panel. Additionally, the input device includes a vibration control circuit for allowing the vibration generation device to generate various forms of vibrations in accordance with the type of the information. The vibration generation device is a bimorph piezoelectric actuator including a first actuator unit and a second actuator unit stacked on the first actuator unit in which when one of the first and second actuator units expands, the other contracts. Further, each of the first and second actuator units has a multi-layered piezoelectric element layer.

14 Claims, 16 Drawing Sheets

FOREIGN PATENT DOCUMENTS

| | | |
|---|---|---|
| JP | 9-161602 | 6/1997 |
| JP | 11 212725 | 8/1999 |
| JP | 11-212725 | 8/1999 |
| JP | 2000-269563 | 9/2000 |
| JP | 2001-202195 | 7/2001 |
| JP | 3085481 | 2/2002 |
| JP | 2002-149312 | 5/2002 |

* cited by examiner $\Delta L1 = d31 \times E \times L$ $\Delta L2 = d31 \times E \times L$
$= \Delta L1$

INPUT DEVICE AND ELECTRONIC DEVICE USING THE INPUT DEVICE

TECHNICAL FIELD

The present invention relates to an input device and an electronic apparatus using the same capable of realizing a feedback to user's input operation through the sense of touch when the user performs an input operation of information by touching a touch panel.

This application claims priority of Japanese Patent Application No. 2002-251781, filed on Aug. 29, 2002, the entirety of which is incorporated by reference herein.

BACKGROUND ART

For example, an ATM (Automated Teller Machine) is here taken as an example of the electronic apparatus. A touch panel is attached to the display surface of the ATM. In the operation using the ATM, a user inputs -information through the touch panel, and a feedback to user's input operation is realized by a device added to the outside of the ATM. The added device realizes the feedback by changing images on the display window of the ATM or by changing sounds using a speaker or sounder.

In the case where a small electronic apparatus such as a PDA, to which the feedback system realized by the method of changing images or sounds is applied, is used outdoor, it may be difficult to sufficiently convey a feedback due to ambient noise or darkness. In addition, when the user points an icon or the like on the display window with a finger, the image may be covered by the finger, so that feedback information due to the change of images cannot be conveyed to the user.

Some attempts to give a tactual feedback to a touch panel in one way or another have already been disclosed.

In the coordinate input device disclosed in Jpn. Pat. Appln. Laid-Open Publication No. 9-251347 (published Sep. 22, 1997), a combination of a touch panel and mechanical switch causes "click sense". The information display device and operation input device disclosed in Jpn. Pat. Appln. Laid-Open Publication No. 11-212725 (published Aug. 6, 1999) uses a piezoelectric element or the like to offer a tactual feedback to a touch panel. In the devices currently available, unless a laminated piezoelectric element or bimorph piezoelectric element is used, displacement is too small to obtain the feedback in practice. Jpn. UM. Appln. Laid-Open Publication No. 63-164127 (published Oct. 26, 1988) describes that a piezoelectric material is used for a touch panel switch to give a tactual feedback to a touch panel. However, the application is limited to an optical touch panel. The display device disclosed in Jpn. Pat. Appln. Laid-Open Publication No. 11-85400 (published May 30, 1999) is a combination of an image display, input device, and vibrator. However, there is no concrete description in the document related to, for example, actuator type or supporting method. The document mainly describes a configuration in which an input detection sensor (unclear type) is provided under the image display device.

DISCLOSURE OF INVENTION

An object of the present invention is to provide a new input device and an electronic apparatus using the input device capable of solving problems of the above conventional techniques.

Another object of the present invention is to provide an input device and an electronic apparatus using the input device capable of surely realizing a feedback to user's input operation performed in accordance with the type of information through the sense of touch when the user performs an input operation of information to a touch panel using the sense of touch.

The present invention includes: a touch panel with which a user performs input operation of information by touching the touch panel; a vibration generation device for feeding back, to the user, various kinds of sense of touch in accordance with the type of the information through the touch panel; and a vibration control circuit for allowing the vibration generation device to generate various forms of vibrations in accordance with the type of the information. The vibration generation device is a bimorph piezoelectric actuator including a first actuator unit and a second actuator unit stacked on the first actuator unit in which when one of the first and second actuator units expands, the other contracts. Each of the first and second actuator units has multi-layered piezoelectric element layer.

With an input device and electronic apparatus using the input device according to the present invention, a user performs input operation of information by touching a touch panel. A vibration generation device feeds back, to the user, various kinds of sense of touch in accordance with the type of the information through the touch panel. A vibration control circuit allows the vibration generation device to generate various forms of vibrations in accordance with the type of the information. The vibration generation device includes a first actuator unit and a second actuator unit. Each of the first and second actuator units has a laminated structure. As the vibration generation device, a bimorph piezoelectric actuator in which when one of the first and second actuator units expands, the other contracts is used. Each of the first and second actuator units has multi-layered piezoelectric element layer.

With the above configuration, the vibration generation device generates various forms of vibrations in accordance with the type of information under the control of the vibration control circuit. As a result, when the user performs input operation by touching the touch panel, the vibration generated in accordance with the type of information can be fed back to the user through the sense of touch. The tactual feedback is similar to "click sense" or "stroke sense" that has been widely used as a feedback to the operation and is advantageous for the user in that it is more intuitive than a feedback due to images or sounds. Further, each of the first and second actuator units included in the bimorph piezoelectric actuator is constituted by multi-layered piezoelectric element layer. Such a laminated piezoelectric actuator can cause greater deflection (bending) displacement in the vibration direction as compared to the case where each of the first and second actuator units is constituted by a single piezoelectric element layer.

The present invention is the input device and an electronic apparatus using the input device, the input device further including an image display unit that displays information. The user can perform the input operation of information by touching a portion on the touch panel corresponding to the position at which the information of the image display unit is displayed, and the vibration generation device is disposed in the image display unit. In the present invention, the image display unit displays information. The user can perform the input operation of information by touching a portion on the touch panel corresponding to the position at which the information of the image display unit is displayed. The vibration generation device is disposed in the image display unit. The vibration generation device feeds back, to the user, various kinds of sense of touch in accordance with the type of the information through the touch panel. When the user selects and touches one of various kinds of information items on the image display unit through the touch panel, the vibration generated in accordance with the selected information can be fed back to the user. As a result, the user can intuitively know the type of information on the image display unit based on the type of the sense of touch. By adding a display function using the sense of touch (vibration) to the touch panel, a feedback to input operation can be realized through the sense of touch. Further, by combining tactual display function with the conventional display function using video, sound or the like, information more abundant in reality can be displayed.

The above and other objects, advantages and features of the present invention will be more apparent from the following description taken in conjunction with the accompanying drawings.

BEST MODE FOR CARRYING OUT THE INVENTION

Preferred embodiments of the present invention will be described below with reference to the accompanying drawings. Incidentally, since the embodiments described below are preferred specific examples of the present invention, technically preferred various limitations are added. However, the scope of the invention is not limited to these embodiments as long as the following description does not contain recitation to specifically limit the invention.

Figure 1:
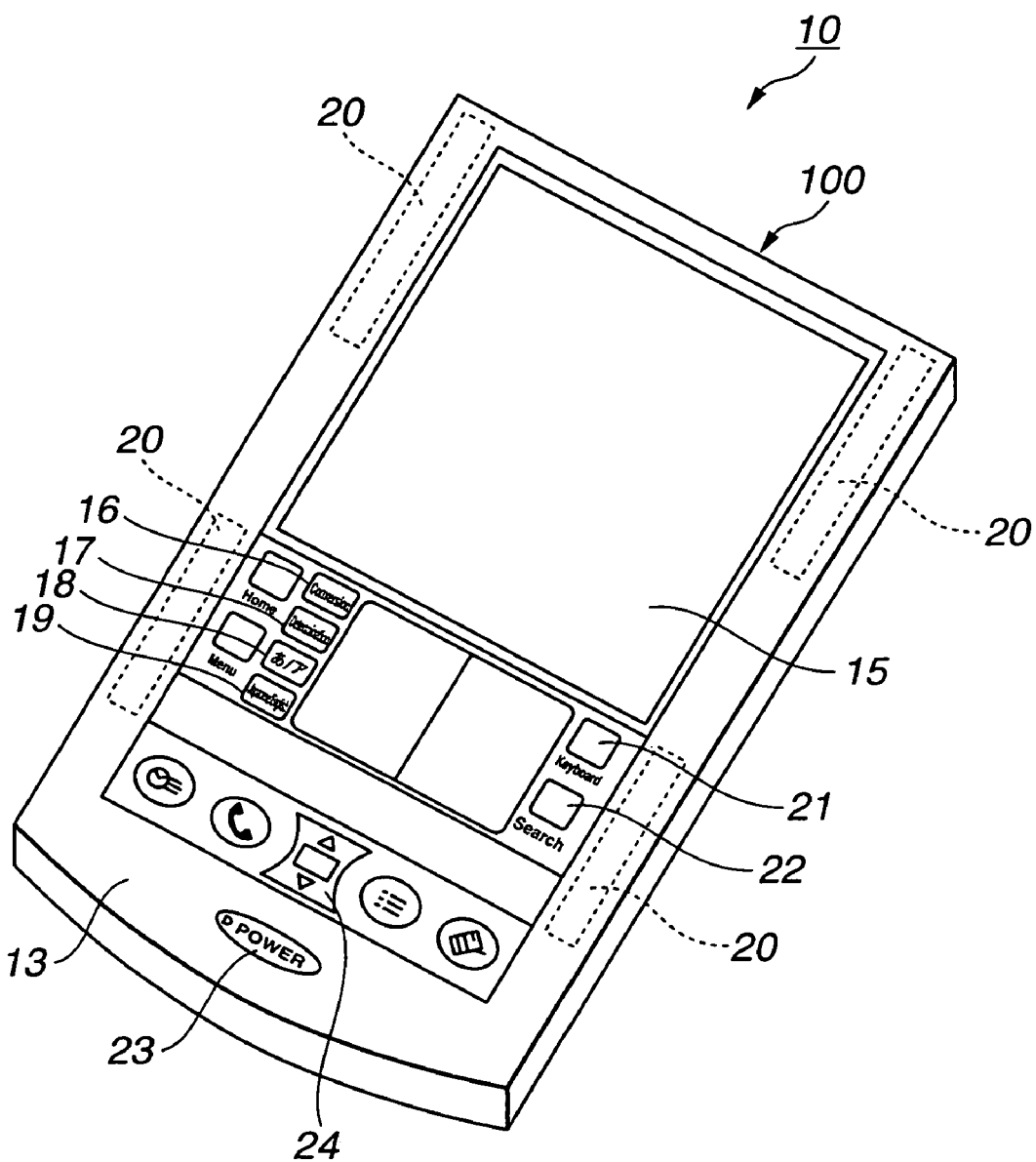
FIG. 1 is a perspective view showing an electronic apparatus provided with an input/output device according to the present invention.

An electronic apparatus 10 provided with an input/output device according to the present invention is a PDA (Personal Digital Assistant) having the configuration as shown in FIG. 1.

In the PDA serving as the electronic apparatus according to the present invention, a tactual feedback generation function using the sense of touch (vibration) is added to the touch panel, so that a feedback to input operation performed in accordance with the type of information can be offered to the user through the sense of touch. The tactual-feedback is similar to "click sense" or "stroke-sense" that has been widely used as a feedback to the operation and is advantageous for the user in that it is more intuitive than a feedback due to images or sounds.

Further, the tactual feedback generation function allows not only a feedback to input operation but various information to be provided to the user like the images or sounds that have been conventionally used.

The electronic apparatus 10 shown in FIG. 1 mainly includes a main body 13, a touch panel 15, a plurality of bimorph piezoelectric actuators 20, and an input/output device 100. Four bimorph piezoelectric actuators are provided in the electronic apparatus of FIG. 1. The main body 13 has some keys 16 to 19, other keys 21, 22, and 24, and a power switch 23. For example, the key 16 functions as a conversion key, key 17 functions as a determination key, and the key 18 as a switch key between Japanese and English. The main body 13 has other required keys.

Figure 2:
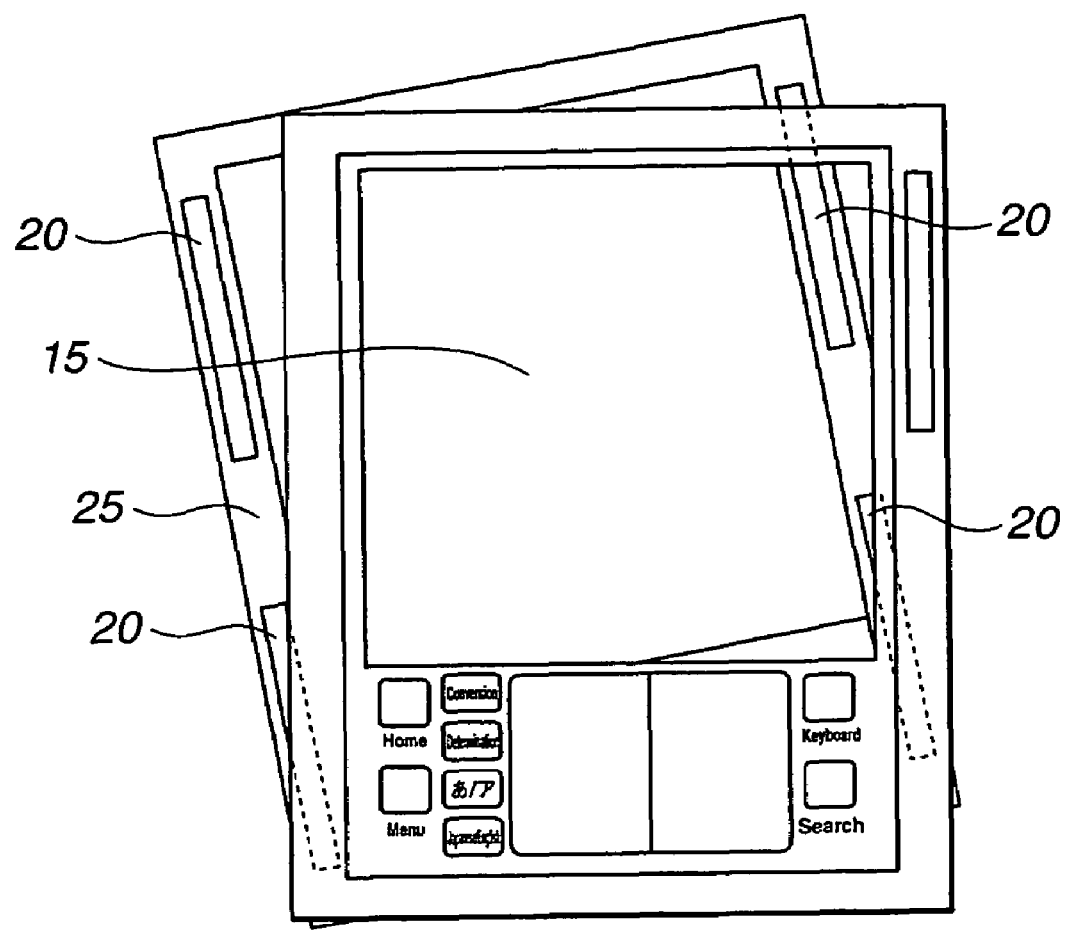
FIG. 2 is a plan view showing a touch panel, support frame, and bimorph piezoelectric actuator of the electronic apparatus shown in FIG. 1.

FIG. 2 shows the touch panel 15 of FIG. 1 and a support frame 25 of the main body 13. At the four corners of the support frame 25, four elongated plate-like bimorph piezoelectric actuators 20 are fixed with, for example, adhesive.

Figure 3:
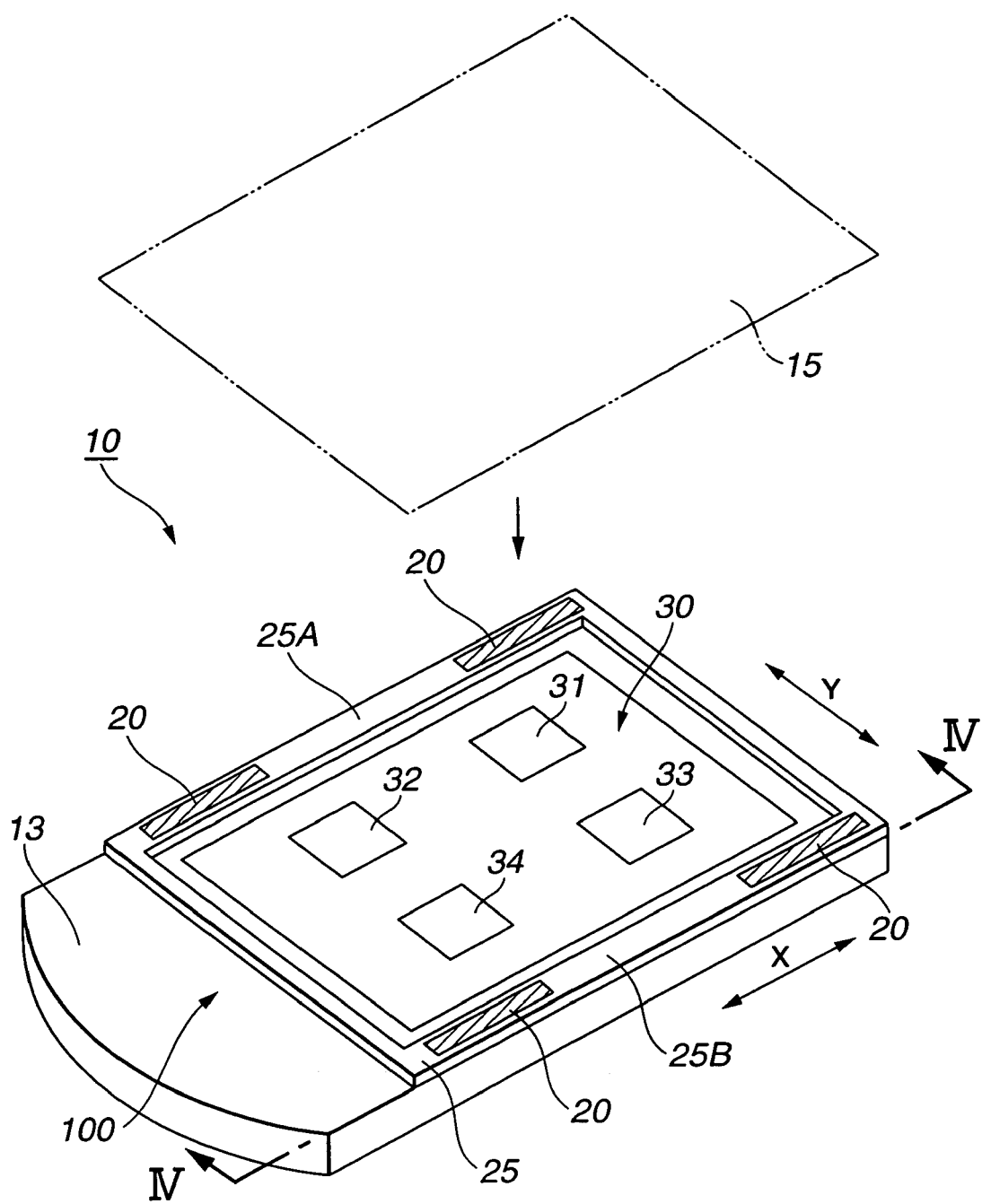
FIG. 3 is an exploded perspective view of the electronic apparatus shown in FIG. 1.

FIG. 3 is an exploded perspective view showing the touch panel 15 and main body 13.

The main body 13 is provided with an image display unit 30 and the support frame 25 of the image display unit 30. A liquid crystal display can be used as the image display unit 30. In addition to the liquid crystal display (LCD), an organic EL (electroluminescence), a CRT (Cathode ray tube) or the like can be used as the image display unit 30. The image display unit 30 can display required icons 31 to 34 as an example in response to an operation of, for example, the key 24 shown in FIG. 1. The support frame 25 is made of, for example, metal, and is a frame body with four sides corresponding to four sides of the image display unit 30. Two bimorph piezoelectric actuators 20 are adhesively fixed in series to each of longitudinal frame portions 25A and 25B of the support frame 25 at a predetermined interval. The bimorph piezoelectric actuators 20 are arranged in parallel to each other in X-direction. The X-direction is the direction perpendicular to Y-direction which is the transversal direction of the main body 13.

The main body 13 is made of, for example, plastic such as PC (Polycarbonate), ABS (Acrylonitrile Butadiene Styrene), or PI (Polyimide), but is not limited to the above materials. The support frame 25 is made of, for example, aluminum, iron plate, or stainless plate, although capable of being made of metal or plastic. The image display unit 30 is the liquid crystal display capable of performing color display.

As the touch panel 15, which is a transparent film, a thin polyester film can be used, for example. The touch panel 15 is vapor deposited with a transparent conducting layer (ITO) in rectangles with a predetermined thickness. Firstly, the above two polyester films are prepared. On one polyester film, conducting layers are formed in rectangles in the longitudinal direction. On the other polyester film, conducting layers are formed in rectangles in the transversal direction. The above two polyester films are allowed to overlap with each other with an insulating spacer interposed therebetween. The interposition of the insulating spacer prevents the conducting layers on both sides from being in contact with each other. When a user (or operator) presses the surface of the polyester film, a current flows through conducting layers on the one polyester film and conducting layers on the other polyester film, so that it is possible to detect which position on the image display unit 30 shown in FIG. 3 is being pressed from the intersection of X-axis and Y-axis. The current that is allowed to flow due to contact between the intersections on the upper and lower layers is processed by an electric circuit. This allows, for example, a CPU (Central Processing Unit) to detect which of the icons 31 to 34 on the image display unit 30 of FIG. 3 has been pressed by the user. The configuration of the above touch panel 15 is not limited, and various configurations are applied to the touch panel 15. The touch panel 15 may be formed by overlapping a transparent glass plate and a transparent film. In this case, when conducting layers on the surface of the glass plate and those on the surface of the film contact each other, it is possible to know which position on the image display unit 30 is being pressed.

Figure 4:
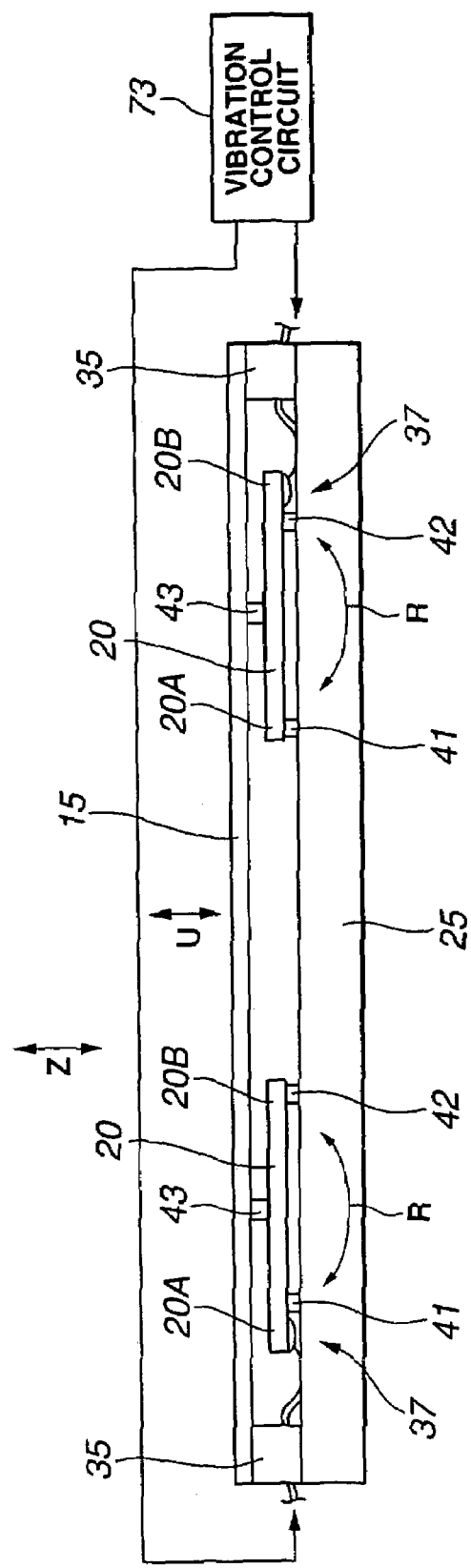
FIG. 4 is a cross-sectional view of the electronic apparatus taken along the line IV-IV in FIG. 3.
Figure 5A:
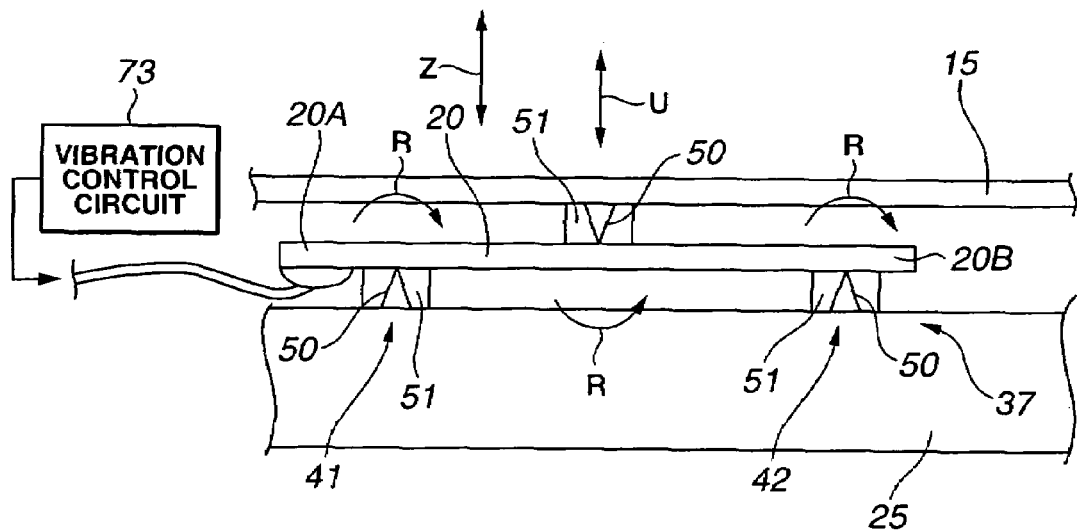
FIG. 5A is an enlarged view of the piezoelectric actuator, vibration transmitting mechanism, and the like shown in FIG. 4.

FIG. 4 is an example of a cross-sectional structure of the electronic apparatus taken along the line IV-IV in FIG. 3. FIG. 5A shows a partly enlarged view of the cross-sectional structure of the electronic apparatus shown in FIG. 4.

In FIG. 4 and FIG. 5A, the above-mentioned four bimorph piezoelectric actuators 20 are disposed between the touch panel 15 and support frame 25. Touch panel support members 35 are disposed so as to provide an interval between the touch panel 15 and support frame 25. The touch panel support members 35 are made of a flexible material that does not absorb vibration, and are positioned at, for example, four corners of the touch panel 15. The above-mentioned bimorph piezoelectric actuators 20 are disposed in the space between the touch panel 15 and support frame 25. The bimorph piezoelectric actuators 20 and a vibration transmission mechanism constitute a vibration generation device, in which a vibration due to deflection displacement of the bimorph piezoelectric actuators 20 is transmitted to the touch panel 15 side.

In the description described below, the term "bimorph piezoelectric actuator 20" is referred to as merely "piezoelectric actuator 20". A first support portion 41 is provided between one end portion 20A of the piezoelectric actuator 20 and support frame 25. Similarly, a second support portion 42 is provided between the other end portion 20B of the piezoelectric actuator 20 and support frame 25. A third support portion 43 is provided between the center of the piezoelectric actuator 20 and the back surface of the touch panel 15.

Figure 5B:
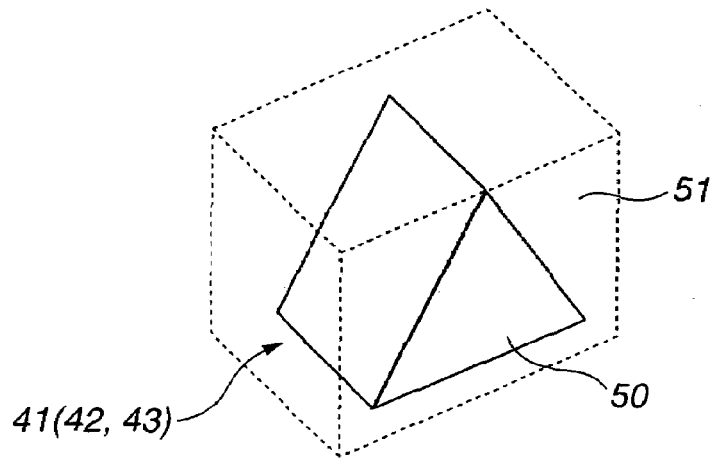
FIG. 5B is a perspective view showing a relationship between a projection and soft adhesive.

FIGS. 5A and 5B show the first support portion 41, second support portion 42, and third support portion 43 in an enlarged manner. As shown in FIGS. 5A and 4, vibration displacement of the piezoelectric actuator 20 is denoted by an arrow U. The vibration displacement U is perpendicular to the direction of the touch panel 15 and support frame 25, that is, corresponds to Z-direction. The Z-direction is perpendicular to the X- and Y-directions shown in FIG. 3.

As shown in FIGS. 4 and 5A, the piezoelectric actuator 20 is three-point supported by the first to third support portions 41 to 43 in the space between the touch panel 15 and support frame 25. The first to third support portions 41 to 43 constitute the above-mentioned vibration transmission mechanism 37 that transmits vibration generated by the piezoelectric actuator 20 to the touch panel 15 side. As shown in FIG. 5A, each of the first to third support portions 41 to 43 is constituted by a knife edge like projection 50 and soft adhesive 51. Each of the first to third support portions 41 to 43 supports the plane of the piezoelectric actuator 20 using the knife edge like projection 50 in such a manner not to obstruct deflective deformation (or bending deformation) of the piezoelectric actuator 20. More specifically, the projection 50 of the first support portion 41 supports the piezoelectric actuator 20 from the support frame 25 side in a manner to allow the piezoelectric actuator 20 to pivotally move in R-direction. Similarly, the projection 50 of the second support portion 42 supports the piezoelectric actuator 20 from the support frame 25 side in a manner to allow the piezoelectric actuator 20 to pivotally move in R-direction. The projection 50 of the third support portion 43 supports the piezoelectric actuator 20 from the touch panel 15 side in a manner to allow the piezoelectric actuator 20 to pivotally move in R-direction.

In the first to third support portions 41 to 43, the soft adhesive 51 allows the projections 50 to adhere to support frame 25 and touch panel 15 to prevent displacement. As the material of the soft adhesive 51, it is possible to use such a material that can fix the projection made of hard material and can transmit the deflection displacement of the piezoelectric actuator 20 to the touch panel 15 side without reduction. Examples of the material of the soft adhesive include styrene elastomer (KG-gel: YMG-80-BK (Kitagawa Industries Co., Ltd)).

FIG. 5B shows the projection 50 and soft adhesive 51. The soft adhesive 51 is denoted by the dotted line.

The vibration displacement U caused by the piezoelectric actuator 20 shown in FIGS. 4 and 5 is in parallel to the Z-direction. In the first to third support portions 41 to 43, the piezoelectric actuator 20 is fixed through the knife edge like projections 50 by the adhesive 51. Therefore, in the first to third support portions 41 to 43, the piezoelectric actuator 20 can freely move in the R-direction, whereas the piezoelectric actuator 20 is restrained in the Z-direction along the vibration displacement U.

Figure 6:
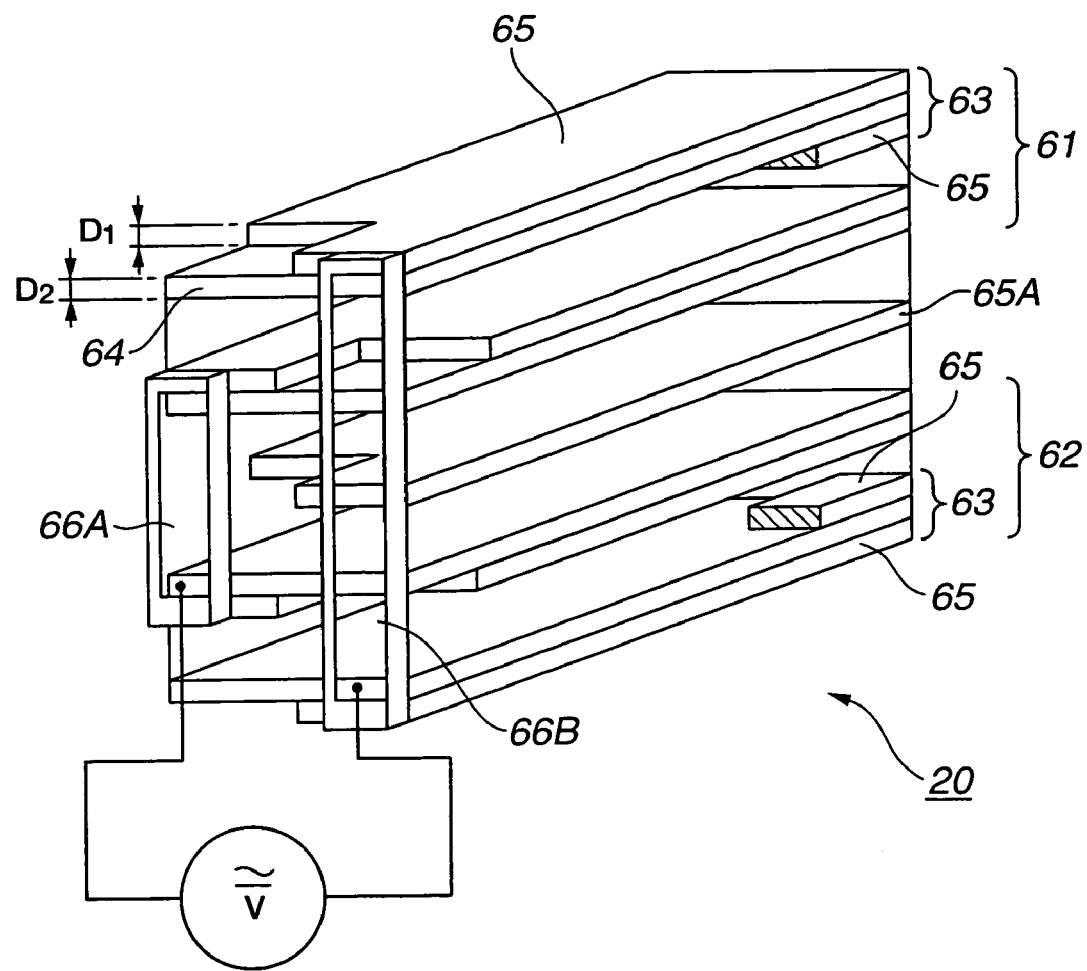
FIG. 6 is a partly omitted perspective view of the bimorph piezoelectric actuator.

A description will next be given of a structural example of the piezoelectric actuator 20 with reference to FIGS. 6 and 7. FIG. 6 is a partly omitted view showing a structure of the piezoelectric actuator 20. The piezoelectric actuator 20 is so-called a bimorph piezoelectric actuator. This bimorph piezoelectric actuator is also referred to as bimorph piezoelectric vibrator or the like. Schematically, the piezoelectric actuator 20 is constituted by laminating a first actuator unit 61 and second actuator unit 62.

The first and second actuators 61 and 62 have substantially the same structure and each has a plurality of piezoelectric element layers 63. The piezoelectric element layer 63 is constituted by three layers, including a piezoelectric element 64 and electrode layers 65 formed on both sides of the piezoelectric element 64. This piezoelectric element layer 63 is also referred to as prime actuator unit. Each of the first and second actuator units 61 and 62 is constituted by laminating a plurality of piezoelectric element layers 63. In the example shown in FIGS. 6 and 7, each of the first and second actuator units 61 and 62 is constituted by laminating nine piezoelectric element layers 63. The piezoelectric element 64 of the piezoelectric element layer 63 is made of, for example, PZT (lead zirconate titanate). The electrode layer 65 is made of, for example, Ag—Pd. An intermediate electrode layer 65A is provided between the first and second actuator units 61 and 62.

Figure 7:
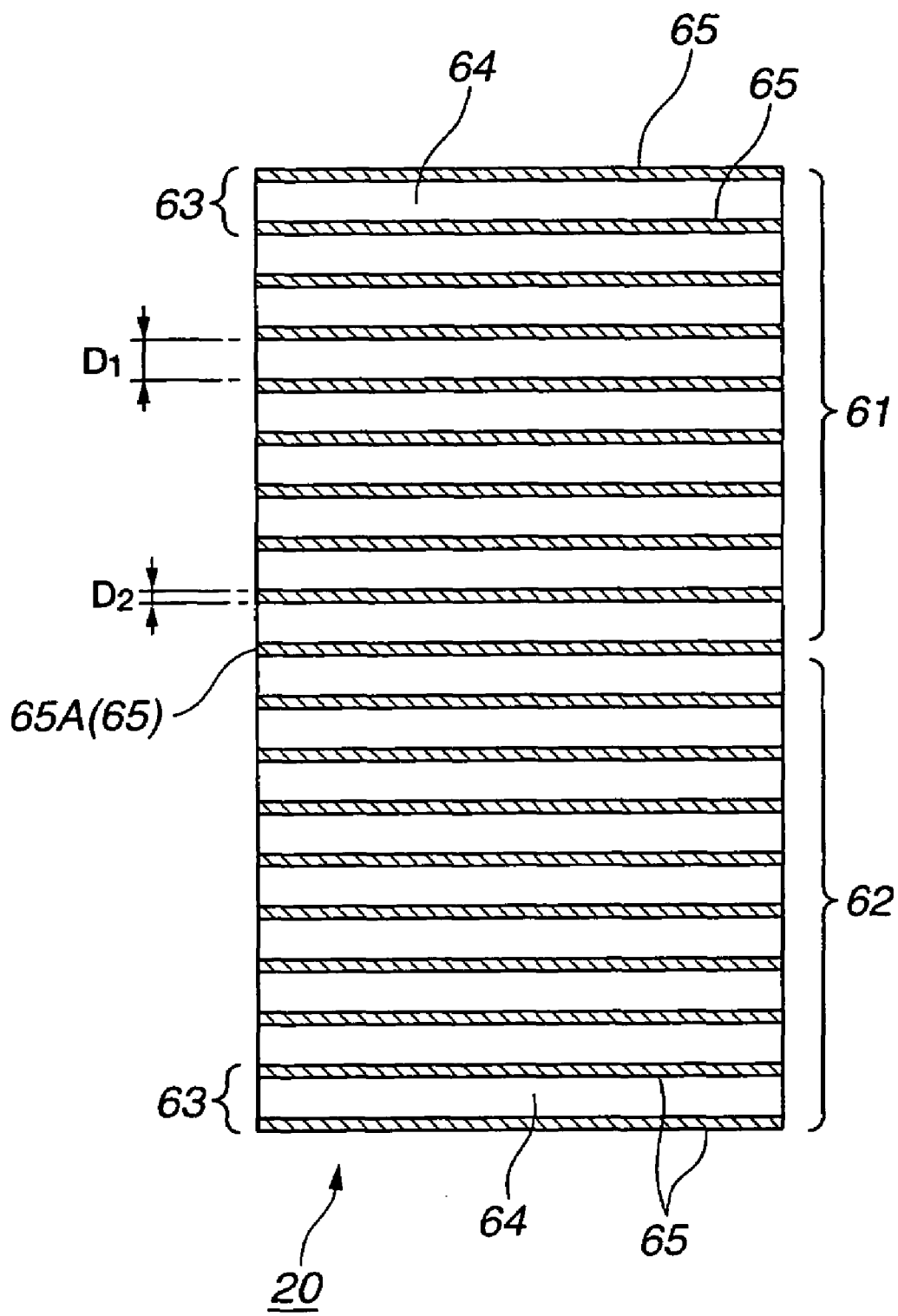
FIG. 7 is a cross-sectional view showing the laminated structure of the bimorph piezoelectric actuator shown in FIG. 6.

The piezoelectric actuator 20 shown in FIGS. 6 and 7 is constituted by eighteen layers of piezoelectric elements 64 and nineteen electrode layers 65 formed between each pair of piezoelectric element 64 and on the front and back of the piezoelectric actuator 20, in total. The thickness $D_1$ of the piezoelectric element 64 shown in FIG. 7 is, for example, 28 μm. The thickness $D_2$ of the electrode layer 65 is, for example, 4 μm. The piezoelectric actuator 20 is constituted by laminating the above-mentioned eighteen piezoelectric element layers 63, which are electrically connected in parallel.

As shown in FIG. 6, interlayer connecting portions 66A and 66B are provided for the piezoelectric actuator 20. The piezoelectric elements 64 of the piezoelectric element layers 63 are polarized such that when a drive current is applied to the interlayer connecting portions 66A and 66B, the nine piezoelectric element layers 63 of the first actuator unit 61 expand/contract and the nine piezoelectric element layers 63 of the second actuator unit 62 contract/expand. Consequently, the bimorph piezoelectric actuator 20 is deflected and displaced on the same principle as a bimetal. The piezoelectric actuator 20 shown in FIG. 7 is very thin and compact with the total thickness thereof being, for example, 500 μm. Such a laminated piezoelectric actuator 20 can cause greater deflection displacement using a limited drive voltage as compared to the case where each of the first and second actuator units 61 and 62 is constituted by a single piezoelectric element layer. When the first actuator unit 61 expands, the second actuator unit 62 contracts; contrary, when the first actuator unit 61 contracts, the second actuator unit 62 expands, so that the piezoelectric actuator 20 is displaced along the vibration displacement U shown in FIG. 4. The above-mentioned bimorph piezoelectric actuator 20 is also referred to as a multi-layered bimorph piezoelectric actuator.

An operation of the bimorph piezoelectric actuator 20 particularly suitable for a small-sized mobile device will next be described.

The mobile electronic apparatus 10 as shown in FIG. 1 uses an Li-ion or Ni-hydrogen battery as a main power source in general. Even when a voltage generated by the battery is applied to the above-mentioned general bimorph piezoelectric actuator battery, it is impossible to obtain enough deflection displacement or force to attract the user's attention. In the present embodiment, to solve this problem, multi-layered bimorph piezoelectric actuator 20 is used to lower the drive voltage needed to generate equivalent deflection displacement and force as follows.

Deflection $\Delta L1$ of the piezoelectric element needed to deform (drive) the bimorph piezoelectric actuator 20 can be represented by the following equation.

$$\Delta L1 = d31 \times E \times L$$

(d31: piezoelectric constant, E: applied electric intensity, L: element length)

Figure 8A:
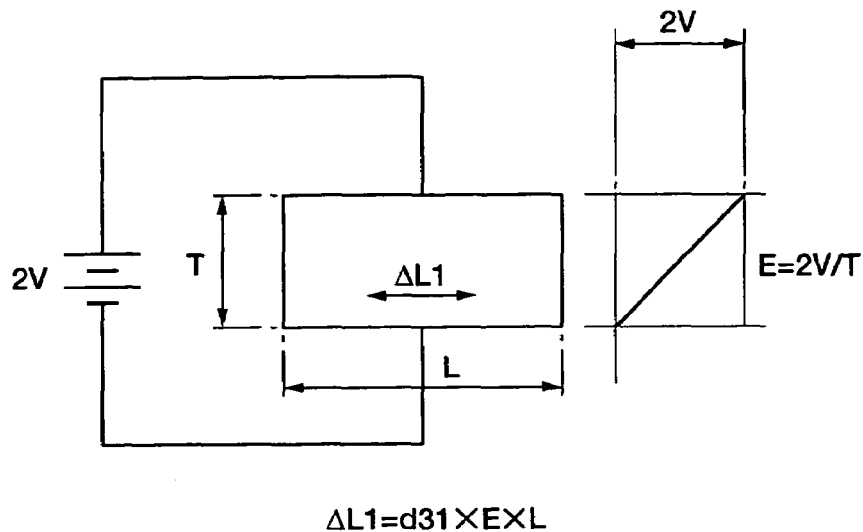
FIG. 8A shows a single-layered bimorph piezoelectric actuator.
Figure 8B:
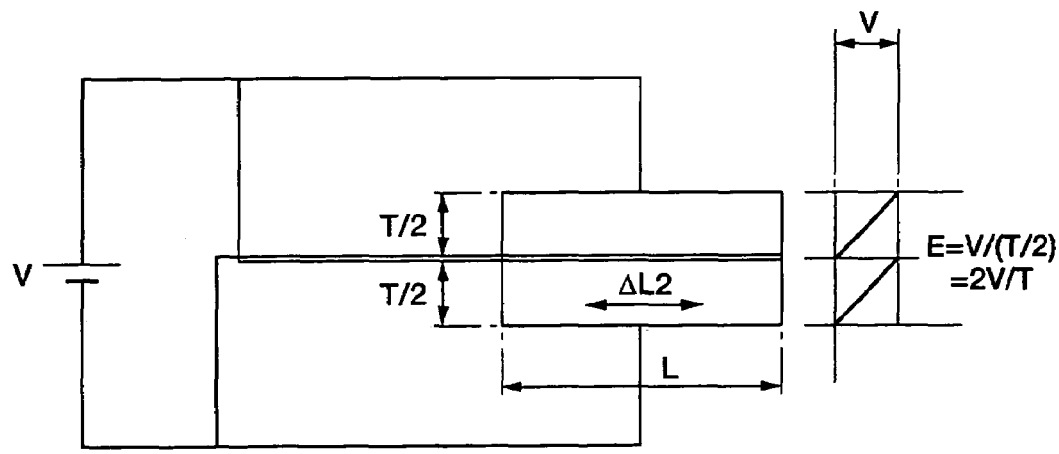
FIG. 8B is a side view showing a multi-layered bimorph piezoelectric actuator.

Deflection is proportional to electric intensity. Thus, even when the used voltage is reduced, deflection remains unchanged as far as electric intensity can be held constant. For example, voltages of 2V and 1V are applied to the elements of FIGS. 8A and 8B, respectively, and the thickness of the element of FIG. 8B is ½ that of element of FIG. 8A. Therefore, the potential gradient inside the element, that is, the electric intensity is the same between the both elements, and consequently, deflection is the same between the two.

As described above, in the present invention, the element is divided in the thickness direction thereof as shown in FIGS. 6 and 7, so that the bimorph piezoelectric actuator 20 that allows the user to perceive the sense of touch with low voltage drive can be realized. It is assumed that the actuator displacement in this example is represented with center displacement caused when the both sides of the actuator are supported at, for example, 20 mm span. In this case, when an applied voltage is 10V, the center displacement is about 25 μm. In order to obtain the displacement corresponding to the above 25 μm with an applied voltage of about 3.3V using, for example, a Li-ion battery with the thickness of the element further sub-divided, the thickness of one element should be about ⅓ that in the case of FIG. 6, that is, about 10 μm.

Figure 9:
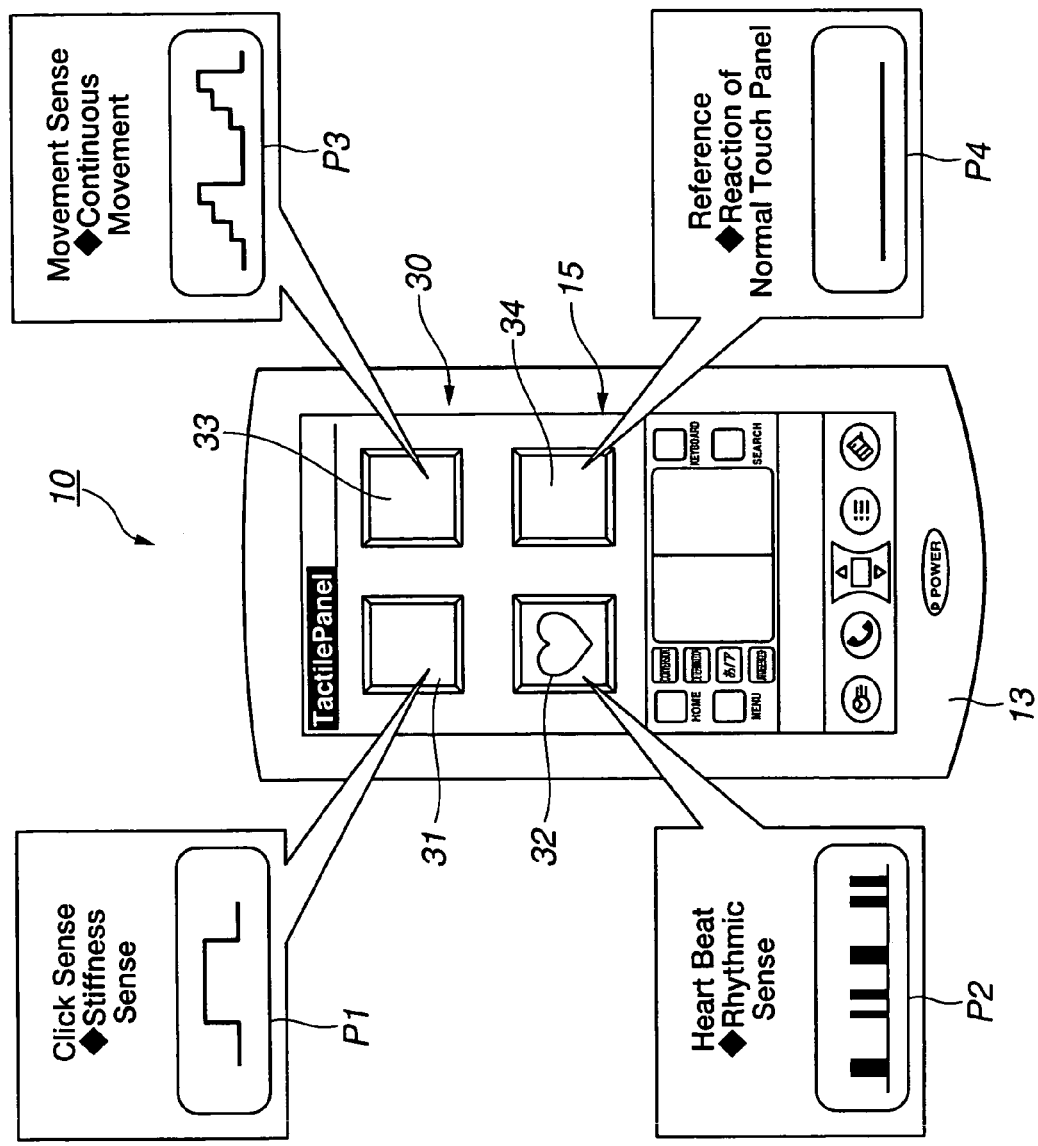
FIG. 9 is a view showing icons displayed as an example on an image display unit and examples of vibration control waveform patterns corresponding to the icons.

The image display unit 30 of the electronic apparatus 10 shown in FIG. 9 displays, for example, four icons 31 to 34. The above-mentioned touch panel 15 is disposed on the image display unit 30.

Figure 10:
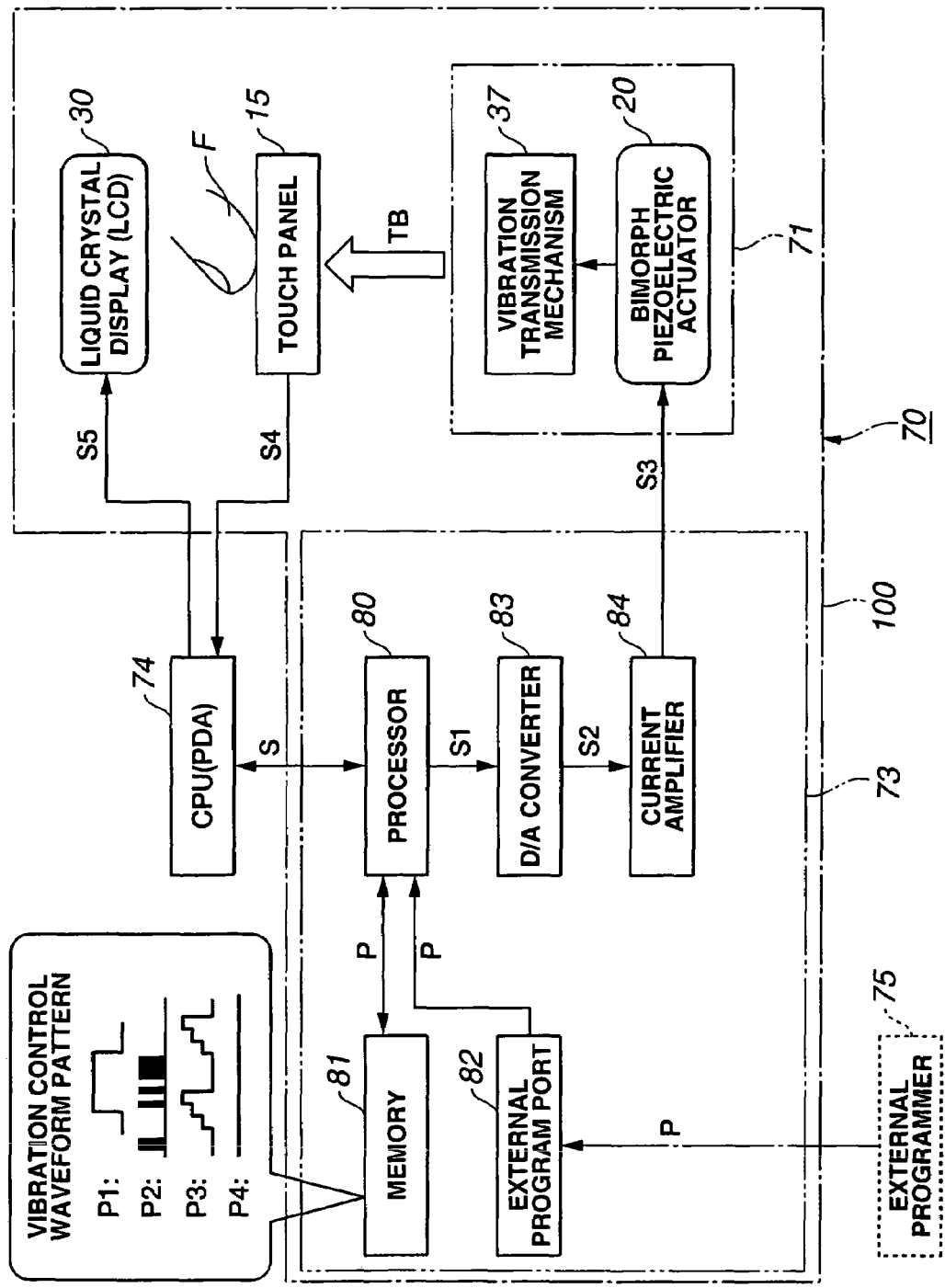
FIG. 10 is a block circuit diagram showing a control block including the input/output device.

FIG. 10 shows an example of a control block of the electronic apparatus 10 shown in FIG. 9. The control block of the electronic apparatus 10 includes a vibration generation device 70, a vibration control circuit 73, a touch panel 15, and an image display unit 30. The CPU (Central Processing Unit) 74, which serves to allow the electronic apparatus 10 to function as a mobile information terminal, processes signals used in the image display unit 30 and touch panel 15. More specifically, the CPU 74 sends a display signal S5 constituting an icon or the like to the image display unit 30 and receives a coordinate value S4 from the touch panel 15. The touch panel 15 is contacted and pressed by a finger F of the user or a stylus (pen).

The vibration generation circuit 73 allows the vibration generation device 71 to generate vibration modes depending on information types. The vibration control circuit 73 and vibration generation device 71, which are not provided in the electronic apparatus 10 that has been widely used, are the characteristic portions of the present invention. The vibration control circuit 73 includes a processor 80, a memory 81, an external program port 82, a D/A converter 83, and a current amplifier 84. The processor 80 is connected to the CPU 74, memory 81, external program port 82 and D/A converter 83.

The memory 81 stores, for example, four vibration modes as shown in FIG. 10. The four vibration modes are, for example, vibration control waveform patterns P1 to P4. The vibration control waveform pattern P (patterns P1 to P4) can be supplied from the memory 81 to the processor 80. These vibration control waveform patterns P1 to P4 correspond to the icons 31 to 34 shown in FIG. 9, respectively. The four icons 31 to 34 are examples of information different from each other and can be randomly displayed on the image display unit 30.

The vibration control waveform pattern P, which is a digital signal, is supplied to the processor 80. In order to supply the memory 81 with the vibration control waveform pattern P, there is available a method in which an arbitral vibration control waveform pattern generated by an external programmer 75 such as an external PC is loaded into the processor 80 via the external program port 82 and registered in the memory 81 after being added with a registration number and property of the vibration control waveform pattern P. Another method for storing the vibration control waveform pattern into the memory 81 is that the vibration control waveform pattern is generated by processor 80 based on the waveform information that has been input through the touch panel 15 and supplied to the memory 81 after being added with a registration number and property. As described above, the external program port 82 supplies the memory 81 with the above-mentioned vibration control waveform pattern that has been generated by the external PC or other external means via the processor 80.

The processor 80 uses a request signal coordinate value S corresponding to the coordinate value S4 (coordinate information) on the touch panel 15 sent from the CPU 74 to select the vibration control waveform pattern P (patterns P1 to P4) corresponding to the request signal coordinate value S from the memory 81 and output the selected vibration control waveform pattern P as a digital waveform S1 to the D/A converter 83. This coordinate value S4 (coordinate information) links to the coordinates of the icons 31 to 34, which are information on the image display unit 30 shown in FIG. 9. As described above, the processor 80 can generate, in its signal processing, the vibration control waveform pattern P that activates the piezoelectric actuator 20 of the vibration generation device 71 based on the information that has been input through an input means such as the touch panel 15 and stored in the electronic apparatus 10 serving as a mobile information terminal without using the external programmer. The above exchange of the request signal coordinate value S corresponding to the coordinate value S4 between processor 80 and CPU 74 allows the coordinate value S4 of the touch panel 15 to be loaded into the processor 80.

The processor 80 sends a digital waveform S1 to the D/A converter 83. The D/A converter 83 then converts the digital waveform S1 into an analog voltage waveform S2. The current amplifier 84 generates a voltage instruction value S3 having enough current to drive the piezoelectric actuator 20 from the analog voltage waveform S2 and sends the generated voltage instruction value S3 to the piezoelectric actuator 20 of the vibration generation device 71. In other words, the current amplifier 84 amplifies the analog voltage waveform S2 so as to allow the analog voltage waveform S2 to have enough current to drive the piezoelectric actuator 20 and sends the amplified waveform to the piezoelectric actuator 20.

The vibration generation device 71 shown in FIG. 10 includes the piezoelectric actuator 20 and vibration transmission mechanism 37.

As described above, the vibration transmission mechanism 37 has the first to third support portions 41 to 43 shown in FIG. 4. The piezoelectric actuator 20 converts the instruction value S3 sent from the current amplifier 84 to mechanical deflection displacement. The vibration transmission mechanism 37 transmits the deflection displacement of the piezoelectric actuator 20 to the touch panel 15 shown in FIG. 4. The electronic apparatus 10 like a mobile information terminal shown in FIGS. 1 and 3 includes an input/output device 100 of FIG. 10. The input/output device 100 includes, as shown in FIG. 10, the image display unit 30, touch panel 15, vibration generation device 71 and vibration control circuit 73.

An operation of the electronic apparatus 10 including the above input/output device 100 will next be described below.

The user is seeing the icons 31 to 34 on the image display unit 30 as shown in FIG. 9 as an example. These icons 31 to 34 show different information from each other. When the user touches the icon 31 through the touch panel 15 with a finger, the coordinate of the icon 31 on the screen of the image display unit 30 is, as shown in FIG. 10, sent from the touch panel 15 to the CPU 74 as a coordinate value S4. The icon 31 and the coordinate value S4 of the icon 31 are previously related to each other in the CPU 74. After the signal (for example, a click icon) representing the icon 31 that has been touched by the user is sent from the CPU 74 to the processor 80 as a request signal coordinate value S, the processor 80 calls up a vibration control waveform pattern P1 corresponding to the icon 31 from the memory 81 and outputs the vibration control waveform pattern P1 to the D/A converter 83 as a digital waveform S1.

The D/A converter 83 converts the digital waveform S1 sent from the processor 80 into an analog voltage waveform S2. The current amplifier 84 amplifies the current value of the analog voltage waveform S2 and supplies the piezoelectric actuator 20 with an instruction value S3. The piezoelectric actuator 20 is mechanically deflected and deformed according to the supplied instruction value S3 (voltage value). Some flexibility is provided for the piezoelectric actuator 20 in such a manner that the first to third support portions 41 to 43 do not obstruct deflective deformation (or bending deformation) of the piezoelectric actuator 20, as shown in FIG. 4. That is, as described above, although the first to third support portions 41 to 43 can freely move in the rotation direction along the arrow R as shown in FIG. 5A, they cannot move in the direction of the arrow U which is the direction of vibration displacement of the piezoelectric actuator 20. This configuration allows the touch panel 15 to be displaced only in the vibration displacement U when the piezoelectric actuator 20 is deflected and deformed. Such vibration displacement U successively caused at the center of the piezoelectric actuator 20 is transmitted as a vibration waveform to the touch panel 15, which is then successively displaced, and is transmitted to the user's finger as a tactual feedback TB.

As described above, in the present invention, by adding the tactual feedback generation function using the sense of touch (vibration) to the touch panel, a feedback to input operation can be realized through the sense of touch. The tactual feedback is similar to "click sense" or "stroke sense" that has been widely used as a feedback to the operation and is advantageous for the user in that it is more intuitive than a feedback due to images or sounds. Further, not only the feedback information but tactual information can be displayed.

In the manner as described above, also when another icon 32 shown in FIG. 9 is selected, the vibration control waveform pattern P2 is called up from the memory 81, and the piezoelectric actuator 20 is vibrated based on the vibration control waveform pattern P2 when receiving the instruction value S3 from the current amplifier 84. Similarly, when the user presses the icon 33 with a finger, the piezoelectric actuator 20 is vibrated and displaced based on the vibration control waveform pattern P3. When the user presses the icon 34 with a finger, the piezoelectric actuator 20 is vibrated and displaced based on the vibration control waveform pattern P4.

As shown in FIG. 9, the vibration control waveform pattern P1 is a rectangular wave pattern generating a "click sense", that is, "stiffness sense". The vibration control waveform pattern P2 is a digital waveform transmitting rhythmic sense such as heartbeat. The pulse width of the waveform pattern P2 is randomly determined. The vibration control waveform pattern P3 is a waveform generating a continuous movement and transmitting movement sense, and has stepped waveform. The vibration control waveform pattern P4 generates reaction of a normal touch panel, that is, assumes substantially constant vibration displacement. As described above, the icons 31 to 34 represent different information from each other. To the icons 31 to 34, the above vibration control waveform patterns P1 to P4 different from each other are assigned. Since the assigned vibration patterns P1 to P4 allow different vibration displacements to be generated in the piezoelectric actuator 20, the user can intuitively and physically distinguish the types of the icons 31 to 34 through a finger. Note that the icons 31 to 34, the coordinate value of the icons, and vibration control waveform patterns can be related to each other in the processor 80 shown in FIG. 10. The sharing of roles between CPU 74 and processor 80 in the signal processing is possible in various combinations and is not particularly limited to the example shown in FIG. 10.

Figure 11:
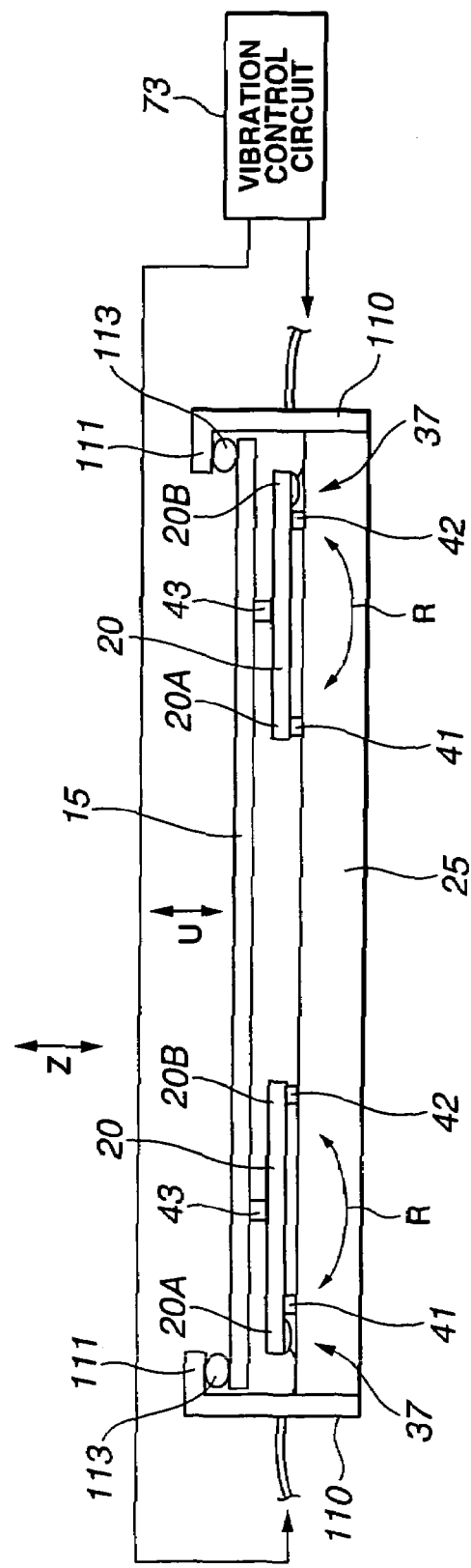
FIG. 11 is a cross-sectional view showing another example of the present invention.
Figure 12:
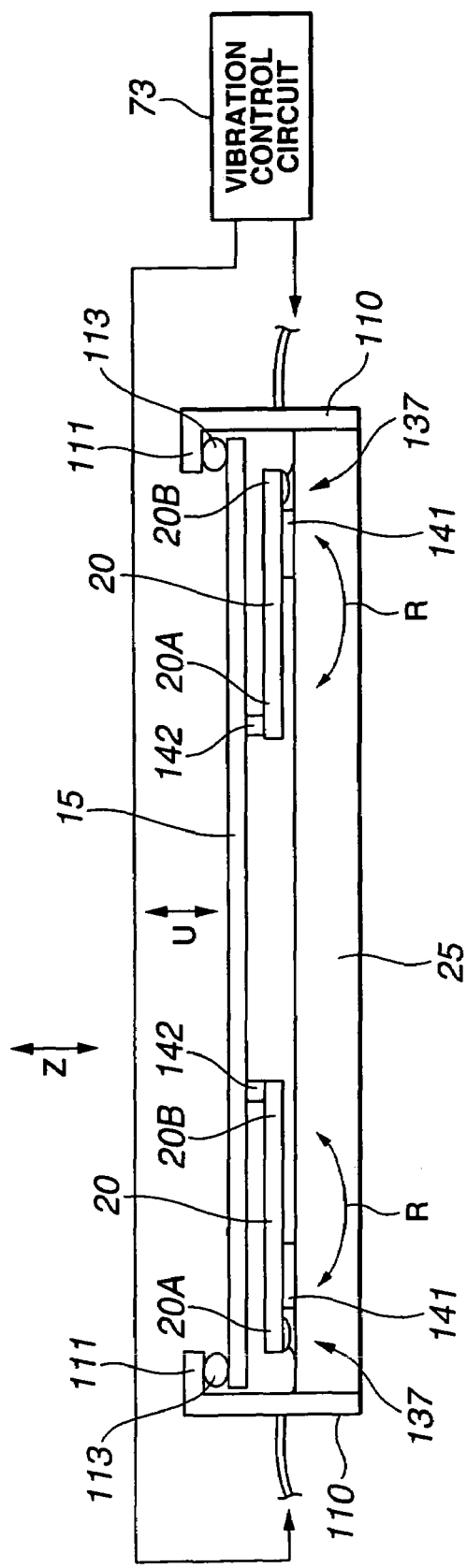
FIG. 12 is a cross-sectional view showing still another example of the present invention.

Each of FIGS. 11 and 12 shows another embodiment of the present invention. Each of examples of FIGS. 11 and 12 has a configuration obtained by adding new components to the example of FIG. 4. In the following, the same reference numerals as those in the example of FIG. 4 denote the same parts as those in the example of FIG. 4.

The example of FIG. 11 differs from that of FIG. 4 in that a panel holding frame 110 is provided over the touch panel 15 and support frame 25. The panel holding frame 110 has a substantially L-shaped cross-section. Through the panel holding frame 110, the end portion of the touch panel 15 is fixed to the support frame 25. The panel holding frame 110 is a frame body having, for example, four sides. A dust seal 113 is provided between an upper end portion 111 of the panel holding frame 110 and the end portion of the touch panel 15. The dust seal 113 is, for example, a ring-shaped elastic member having a square-shaped cross section, circular cross-section or elliptic cross-section and is made of, for example, plastic or rubber. The dust seal 13 prevents dust or foreign particles from entering into the space between the touch panel 15 and support member 25. The dust seal 113 also serves as a touch panel support member that supports the touch panel 15 from the panel holding frame 110 side. The dust seal 113 is made of a very flexible material or a material having a certain level of flexibility and property that does not attenuate vibration and minimizes the attenuation of the vibration displacement generated in the piezoelectric actuator 20.

The example of FIG. 12 differs from that of FIG. 4 in the configuration of the vibration transmission mechanism 137 as well as the addition of the dust seal 113 and panel holding frame 110 of FIG. 11. In FIG. 4, the piezoelectric actuator 20 is three-point supported by the first to third support portions 41 to 43 in the space between the touch panel 15 and support frame 25. On the other hand, in the embodiment of FIG. 12, the vibration transmission mechanism 137 has a support portion 141 and another support portion 142. The support portion 141 is disposed between one end portion 20A of the piezoelectric actuator 20 and support frame 25. The another support portion 142 is disposed between the other end portion 20B of the piezoelectric actuator 20 and the inside surface of the touch panel 15. The configuration of the support portion 142 is the same as that shown in FIGS. 5A and 5B having the projection 50 and soft adhesive 51. The support portion 141 is rigidly fixed to the support frame 25 of the image display unit by hard adhesive. As described above, the piezoelectric actuator 20 is two-point supported by the support portions 141 and 142 in the space between the touch panel 15 and support frame 25. When the piezoelectric actuator 20 is deflected and displaced, the touch panel 15 is displaced in the vibration displacement U. The piezoelectric actuator 20 as described above is supported in the space between the touch panel 15 and support frame 25 in a cantilever manner.

Figure 13:
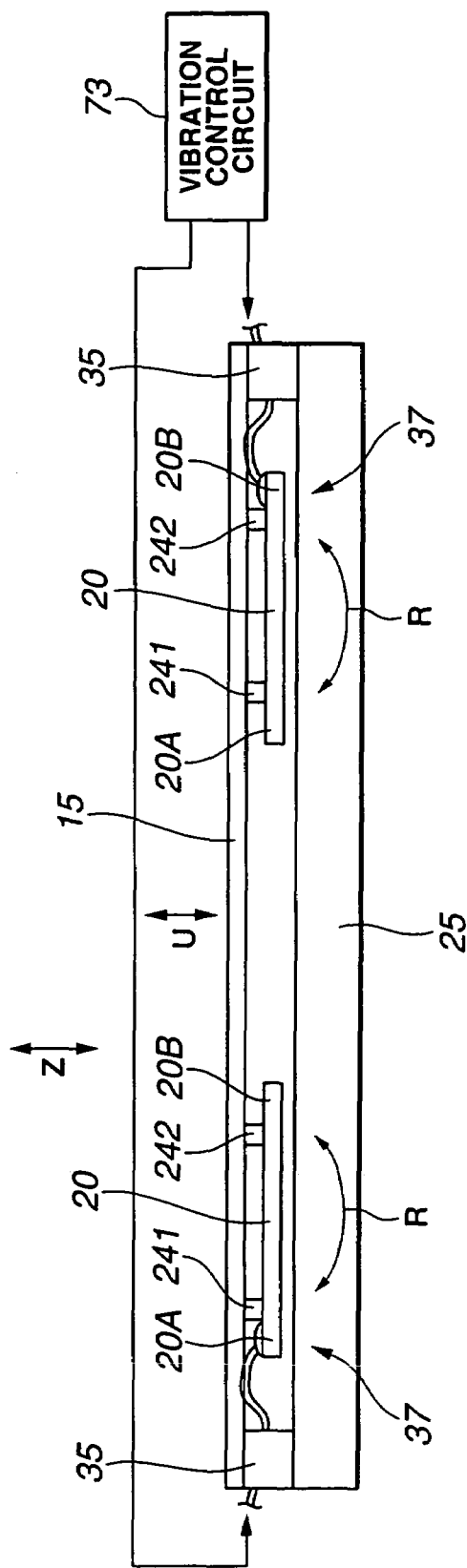
FIG. 13 is a cross-sectional view showing still another example of the present invention.
Figure 14:
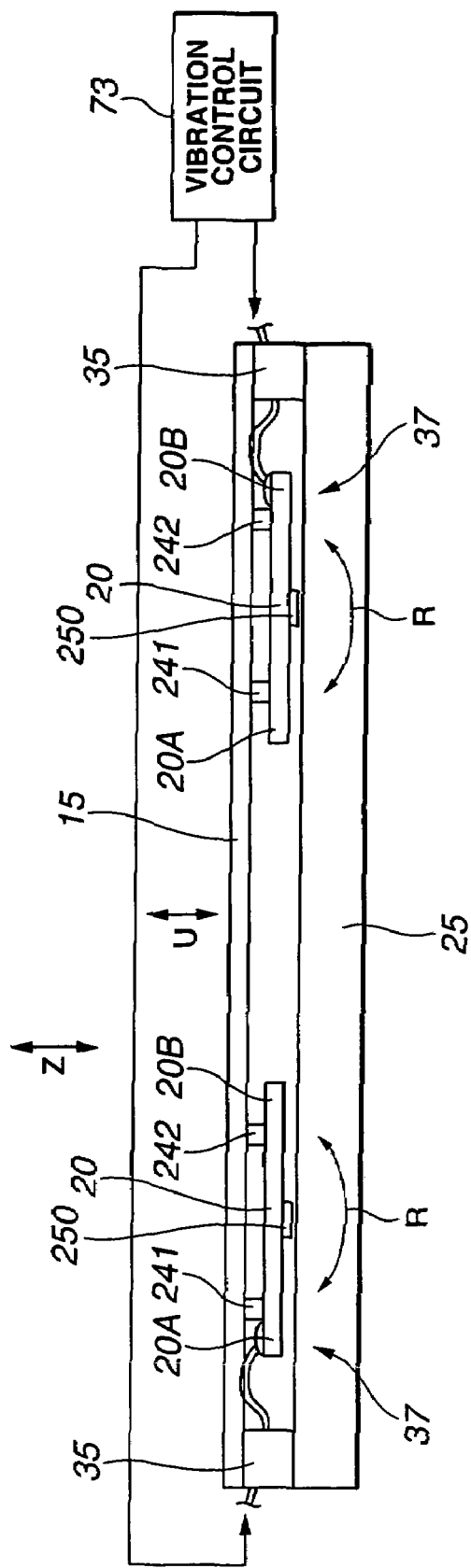
FIG. 14 is a cross-sectional view showing still another example of the present invention.

Each of FIGS. 13 and 14 shows still another embodiment of the present invention.

In the example of FIG. 13, the piezoelectric actuator 20 is supported only from the touch panel 15 side. One end portion 20A of the piezoelectric actuator 20 is supported by a support portion 241, and the other end portion 20B thereof is supported by a support portion 242. This configuration also allows the piezoelectric actuator 20 to freely move in the rotation direction R and vibration to be caused in the touch panel 15 in the direction of the vibration displacement U.

The example of FIG. 14 has a configuration obtained by adding a spindle 250 to the configuration of the example of FIG. 13. The spindle 250 is fixed to the intermediate portion of the piezoelectric actuator 20. The inertial force of the spindle 250 is generated when the defection displacement U is caused in the piezoelectric actuator 20. The reaction force generated when the piezoelectric actuator 20 presses up the touch panel 15 is held by the inertial force of the spindle 250, so that the deflection displacement of the piezoelectric actuator 20 can effectively be transmitted to the touch panel 15. The configuration as shown in FIGS. 13 and 14 in which the piezoelectric actuator 20 is supported only from the touch panel 15 side has the following advantage. That is, the force applied to the touch panel 15 by the user is directly applied to the piezoelectric actuator 20. Thus, even when excessive force is applied to the touch panel 15 by the user, external force load is not applied to the piezoelectric actuator 20.

Figure 15:
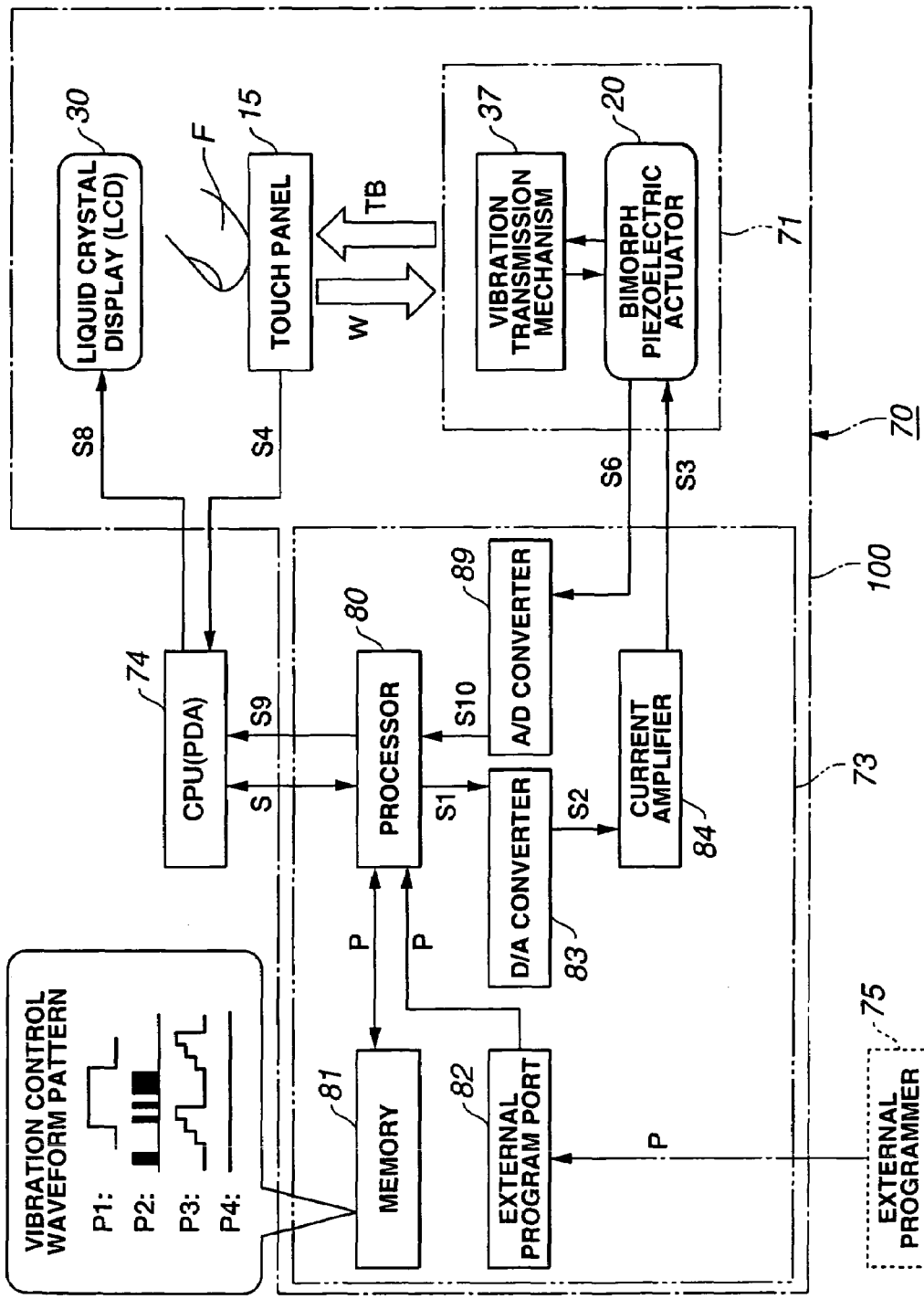
FIG. 15 is a block circuit diagram showing another example of the control block constituting the input device according to the present invention.

FIG. 15 shows another example of the control block 70 shown in FIG. 10. The control block 70 of FIG. 15 differs from that shown in FIG. 10 in that the vibration control circuit 73 includes an A/D converter 89. For measurement of a voltage S6 between terminals in the piezoelectric actuator 20, the A/D converter 89 takes in the voltage S6, A/D converts the voltage S6 into a digital voltage S10 and sends the obtained digital voltage S10 to the processor 80. In the present invention, the piezoelectric actuator 20 and touch panel 15 are directly connected to each other as shown in, for example, in FIG. 4, so that the force applied to the touch panel 15 by the user is directly transmitted to the piezoelectric actuator 20. Accordingly, the connection portions between the piezoelectric actuator 20 and touch panel 15 are displaced depending on the applied force. When receiving the displacement, the piezoelectric actuator 20 generates an electromotive force proportional to the received displacement. Therefore, it is possible for the processor 80 to know the operation force (pressing force) of the user's finger F by measuring the electromotive force. As described above, the processor 80 can measure in real time the voltage S6 of the piezoelectric actuator 20 that corresponds to a pressing force W caused when the user presses the touch panel 15 with a finger F. This brings about the following advantages.

That is, when the user applies excessive force to the touch panel 15 with a finger F, the processor 80 instructs the CPU 74 to supply the image display unit 30 with a display signal S5 constituting the icon indicating that operation by the excessive force has been detected. With this configuration, an alert to the user about the applied excessive force can be made through the icon displayed on the image display unit 30. Further, it is possible to identify (authenticate) the user by measuring the operation force (writing pressure) at the time of handwriting input using an input pen or the like and storing the measured force in correspondence with the user. Further, by combining coordinate information (two-dimensional coordinate information) obtained from the touch panel 15 and information related to the operation force of the user, a three-dimensional input device can be realized.

Figure 16:
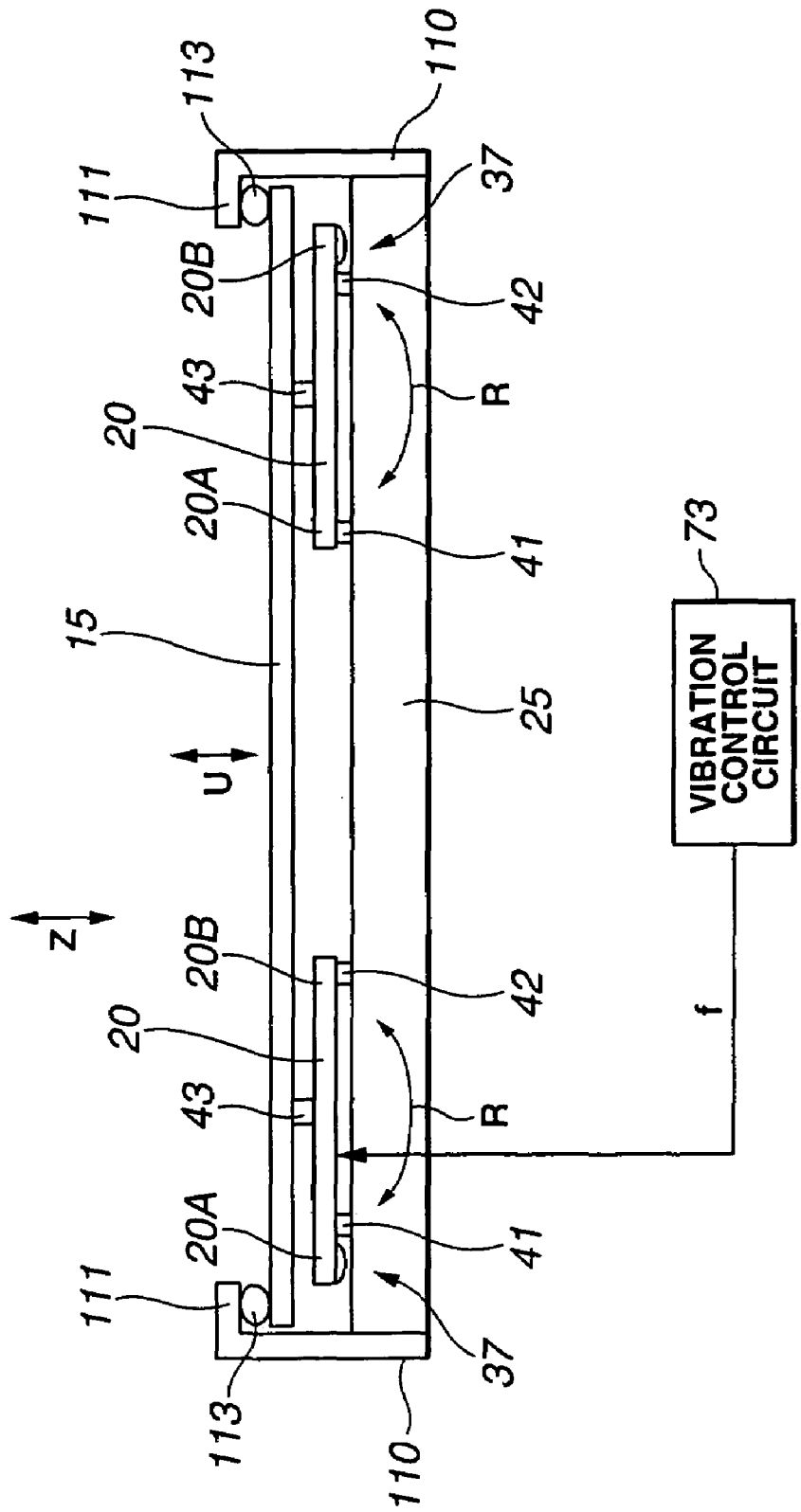
FIG. 16 is a view showing an example of a vibration instruction method for effectively vibrating a touch panel at a specified vibration frequency in the bimorph piezoelectric actuator according to the present invention.

FIG. 16 shows an example of a vibration instruction method for effectively vibrating the touch panel 15 at a specified vibration frequency.

Assuming that the touch panel 15 and first to third support portions 41, 42, and 43 constitute one vibration system, natural frequency f of the system can be represented by the following equation.

$$f = 1/2\pi \times (Kt/m - (Ct/2m))^{1/2}$$

where m is mass of the touch panel 15, Kt and Ct are spring constant and viscosity coefficient of all members connected to the touch panel 15.

By allowing the vibration control circuit 73 of FIG. 10 to output a vibration waveform including the above natural frequency as an instruction value, the touch panel 15 can be effectively vibrated. The vibration waveform including the natural frequency mentioned here includes not only continuous vibration such as sine wave, but vibration obtained by combining various frequency components, such as impulsive vibration. In order to adjust the natural frequency of the system to a range of 50 Hz to 300 Hz, at which the human easily perceives the sense of touch, the above spring constant Kt or viscosity coefficient Ct should be set to an appropriate value after the material or the shape of the support portions or the like connected to the touch panel has been changed.

It is preferable that the multi-layered bimorph piezoelectric actuator include four or more piezoelectric element layers. Particularly, a mobile apparatus such as a PDA cannot use the conventional piezoelectric actuator due to limitation of drive voltage. To cope with this, the piezoelectric layer having multi-layered structure is used to realize an actuator that can be driven with a relatively low voltage and the obtained actuator is used for the tactual feedback to the touch panel. Thus, the touch panel having a tactual feedback function can be realized also in the mobile apparatus. The support portions of the both end portions and center of the bimorph piezoelectric actuator have flexibility in the rotation direction but restrain the direction that the sense of touch is transmitted (displacement direction of the center of the actuator). To restrain the transmission direction of the sense of touch, a point-like or linear projection is used so as not to obstruct the deformation of the actuator. To connect the actuator and support members, soft adhesive is used.

In order not to impair vibrational displacement (speed) generated by the actuator, the actuator itself is configured to serve as the support member of the touch panel. The material that supports the touch panel also serves as a dust seal that prevents dust or the like from entering between the touch panel and image display unit. By setting the natural frequency of the vibration system including the touch panel and its support members to a frequency region at which the human easily perceives the sense of touch, and by vibrating the touch panel with vibration including the natural frequency itself of the vibration system/frequency of the vibration system, the tactual feedback can effectively be transmitted to the user.

The vibration control circuit stores one or more control pattern (vibration waveform). An appropriate control pattern is selected by the apparatus in accordance with the coordinate (linking to an icon or the like, in general) on the touch panel to be selected by the user to control the actuator. The control pattern stored in the vibration control circuit is defined by software and can arbitrarily be rewritten by a manufacturer or user. The vibration control circuit includes a means for detecting electromotive force which is caused when an external force is applied to the actuator, thereby measuring the pressing force of the user's input operation.

A configuration in which one end portion of the bimorph piezoelectric actuator is fixed to a base or the like and the other end portion thereof is connected to the touch panel can be adopted.

In order not to impair the vibrational displacement (speed) generated by the actuator, the touch panel is supported through a flexible material having a low damping effect (for example, KG-gel manufactured by Kitagawa Industries Co., Ltd). In order not to obstruct the bending deformation of the piezoelectric actuator, the piezoelectric actuator is supported below the under surface of the touch panel, and thereby the vibration caused when the piezoelectric actuator is displaced is transmitted to the touch panel. In this case, a spindle can be added to the center of the piezoelectric actuator.

By using the bimorph piezoelectric actuator, a tactual feedback system suitable for a mobile apparatus, which is featured by its compact size (thin-shape) and low power consumption can be designed. In particular, by using the multi-layered bimorph piezoelectric actuator, a low voltage drive type tactual feedback system that operates with an Li-ion or Ni-hydrogen battery that is generally used in a mobile apparatus as a main power source can be designed. Further, the support of the bimorph piezoelectric actuator can be realized with a simple and low-priced structure. The actuator itself serves as a support member of the touch panel, not only preventing vibration loss due to support members but making the structure simple, so that a low-priced system can be provided. The support member of the touch panel serves as a dust seal, reducing the number of components, with the result that a low-priced system can be provided. It is possible to generate vibration that the user can tactually perceive even with a reduced output of the actuator, so that a small-sized and low-priced system can be provided.

The input device can perform a vibrational (tactual) feedback having an arbitral waveform, so that it is possible to provide the sense of operation for confirming input operation as well as various tactual information (sense) to the user. By utilizing the tactual information as a third information presentation channel in addition to visual and auditory information, it is possible to provide rich and varied information more abundant in reality to the user. Further, by utilizing the point that the sense of touch is more fundamental for the human than the sense of sight and hearing, there occurs a possibility that emotions of the human will be expressed. Further, it is assumable that the tactual feedback is independently used. In this case, so-called a blind operation is enabled for information presentation to blind persons, or to the user while driving, under noisy environment or the like where visual or auditory information is not useful. The vibration waveform can easily be rewritten and new vibration waveform can easily be added, so that it is possible to set the vibration waveform for each country where the apparatus is used or to set the vibration pattern depending on individual taste. Further, the vibration pattern created by a user can be provided to another user via, for example, a network.

It is possible to grasp how the user uses the apparatus, preventing the apparatus from being destroyed. The parts needed for providing the sense of touch and the parts required for detecting the operation force are almost common, so that a low-priced three-dimensional input device can be provided. Since the materials that support the touch panel have flexibility, the displacement generated by the piezoelectric actuator is not mechanically suppressed. Further, the materials have low vibration absorption properties (like, for example, a rubber material), so that the energy generated by the piezoelectric actuator can effectively be transmitted to the touch panel. The force applied to the touch panel by the user is not directly applied to the piezoelectric actuator, so that even when excessive force is erroneously applied to the touch panel by the user, external force load is not applied to the piezoelectric actuator. The reaction force generated when the piezoelectric actuator presses up the touch panel is held by the inertial force of the spindle, so that the deflection displacement of the piezoelectric actuator can effectively be transmitted to the touch panel.

The present invention is not limited to the above example. For example, as to the laminated structure of the bimorph piezoelectric actuator 20, each of the first and second actuator units has nine piezoelectric element layers 63. However, the number of layers of the piezoelectric element layer 63 is not limited to nine. It is only necessary that each unit has multi-layered piezoelectric element layers 63. It is preferable for each unit to have four or more piezoelectric element layers 63. In this case, greater deflection displacement can be obtained with a low drive voltage. In the examples shown in the drawings, the first and second support portions are disposed on the side of the image display unit and the third support portion is disposed on the side of the touch panel. Alternatively, however, a configuration in which the first and second support portions are disposed on the side of the touch panel and the third support portion is disposed on the side of the image display unit can be adopted.

As the electronic apparatus according to the present invention, a personal digital assistants (PDA) has been taken as an example. The electronic apparatus 10 of the present invention having the input/output device 100 is not limited to the personal digital assistants but includes all electronic apparatuses provided with a touch panel as an input means, such as a mobile phone, a remote controller, a DSC (Digital Still Camera), a DVC (Digital Video Coder), a PC (Personal Computer).

Further, in the electronic apparatus according to the present invention, the touch panel and a display function are integrated. Alternatively, however, a display function can be separated from the touch panel like, for example, a touch pad of a lap-top computer, and a display unit can independently be provided. Also in this case, the sense of touch is transmitted through the touch panel to the user.

INDUSTRIAL APPLICABILITY

As described above, according to the present invention, a feedback to user's input operation performed in accordance with the type of information can surely be realized through the sense of touch when the user performs an input operation of information to a touch panel using the sense of touch.

The invention claimed is:

1. An input device, comprising:
a support frame;
a touch panel configured to receive an input operation of information by a pressure exerted on the touch panel;
a vibration generation device configured to generate various forms of vibrations, in accordance with the information, through the touch panel;
a plurality of tapered projections constructed to contact a face of the touch panel closest to the support frame and to contact the vibration generation device;
a touch panel support member constructed to contact the touch panel and the support frame and to extend farther from the touch panel to the support frame than a face of the vibration generation device farthest from the touch panel extends to the support frame; and
a vibration control circuit configured to control the vibration generation device to generate the various forms of vibrations in accordance with the information, the vibration generation device being a bimorph piezoelectric actuator including a first actuator unit and a second actuator unit stacked on the first actuator unit in which when one of the first actuator unit and the second actuator unit expands, an other of the first actuator unit and the second actuator unit contracts, each of the first actuator unit and the second actuator unit having a multi-layered piezoelectric element layer.

2. The input device according to claim 1, further comprising:
an image display unit configured to display information, wherein,
the input operation of information is performed by exerting the pressure on a portion on the touch panel corresponding to a position at which the information of the image display unit is displayed, and
the vibration generation device is disposed in the image display unit.

3. The input device according to claim 2, wherein electrodes are disposed on both sides of each piezoelectric element included in the first actuator unit and the second actuator unit.

4. The input device according to claim 2, wherein,
a first of the plurality of tapered projections is constructed to contact one end portion of the bimorph piezoelectric actuator and the touch panel;
a second of the plurality of tapered projections is constructed to contact an other end portion of the bimorph piezoelectric actuator and the touch panel; and
a third of the plurality of tapered projections is constructed to contact a center of the bimorph piezoelectric actuator and the support frame.

5. The input device according to claim 2, wherein a spindle is fixed to an intermediate portion of the bimorph piezoelectric actuator.

6. The input device according to claim 4 wherein,
the first of the plurality of tapered projections has a soft adhesive for fixing the first of the plurality of tapered projections to the bimorph piezoelectric actuator and the touch panel,
the second of the plurality of tapered projections has a soft adhesive for fixing the second of the plurality of tapered projections to the bimorph piezoelectric actuator and the touch panel, and
the third of the plurality of tapered projections has a soft adhesive for fixing the third of the plurality of tapered projections to the bimorph piezoelectric actuator and the support frame.

7. The input device according to claim 2, wherein the image display unit includes a liquid crystal display unit and has a dust seal constructed to prevent dust from entering between the touch panel and the liquid crystal display unit.

8. The input device according to claim 2, wherein,
the vibration control circuit is configured to store a plurality of vibration control waveform patterns for the bimorph piezoelectric actuator, and
the plurality of vibration control waveform patterns correspond to the information displayed on the image display unit.

9. The input device according to claim 8, wherein one of the plurality of vibration control waveform patterns stored in the vibration control circuit can be rewritten.

10. The input device according to claim 8, wherein the vibration generation device includes an electromotive force detection device configured to detect an electromotive force which is generated depending on a pressing force applied to the bimorph piezoelectric actuator.

11. An electronic apparatus having an input device for inputting information, the input device comprising:
a support frame;
a touch panel configured to receive an input operation of information by a pressure exerted on the touch panel;
a vibration generation device configured to generate various forms of vibrations, in accordance with the information, through the touch panel;
a plurality of tapered projections constructed to contact a face of the touch panel closest to the support frame and to contact the vibration generation device;
a touch panel support member constructed to contact the touch panel and the support frame and to extend farther from the touch panel to the support frame than a face of the vibration generation device farthest from the touch panel extends to the support frame; and
a vibration control circuit configured to control the vibration generation device to generate the various forms of vibrations in accordance with the information, the vibration generation device being a bimorph piezoelectric actuator including a first actuator unit and a second actuator unit stacked on the first actuator unit in which when one of the first actuator unit and the second actuator unit expands, an other of the first actuator unit and the second actuator unit contracts, each of the first actuator unit and the second actuator unit having a multi-layered piezoelectric element layer.

12. The electronic apparatus according to claim 11, further comprising:

an image display unit configured to display information, wherein the input operation of information is performed by exerting the pressure on a portion on the touch panel corresponding to a position at which the information of the image display unit is displayed, and the vibration generation device is disposed in the image display unit.

13. The electronic apparatus according to claim 12, wherein electrodes are disposed on both sides of each piezoelectric element included in the first actuator unit and the second actuator unit.

14. The electronic apparatus according to claim 11, wherein the electronic apparatus is a portable electronic apparatus.

* * * * *